United States Patent
Lindert et al.

(10) Patent No.: US 8,344,452 B2
(45) Date of Patent: Jan. 1, 2013

(54) METAL GATE TRANSISTORS WITH RAISED SOURCE AND DRAIN REGIONS FORMED ON HEAVILY DOPED SUBSTRATE

(75) Inventors: Nick Lindert, Beaverton, OR (US); Justin K. Brask, Portland, OR (US); Andrew Westmeyer, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 42 days.

(21) Appl. No.: 12/011,439

(22) Filed: Jan. 24, 2008

(65) Prior Publication Data

US 2008/0142840 A1    Jun. 19, 2008

Related U.S. Application Data

(62) Division of application No. 10/955,669, filed on Sep. 29, 2004, now Pat. No. 7,332,439.

(51) Int. Cl.
*H01L 29/78* (2006.01)
(52) U.S. Cl. ........ 257/344; 257/345; 257/382; 257/384; 257/412
(58) Field of Classification Search .......... 257/344, 257/349, 382, 384, 345, 412
See application file for complete search history.

(56) References Cited

U.S. PATENT DOCUMENTS

| | | | |
|---|---|---|---|
| 4,198,250 A | | 4/1980 | Jecmen |
| 5,627,097 A * | | 5/1997 | Venkatesan et al. .......... 438/217 |
| 6,171,910 B1 | | 1/2001 | Hobbs et al. |
| 6,214,679 B1 * | | 4/2001 | Murthy et al. ............... 438/299 |
| 6,326,664 B1 * | | 12/2001 | Chau et al. .................... 257/344 |
| 6,524,920 B1 | | 2/2003 | Yu |
| 6,753,230 B2 * | | 6/2004 | Sohn et al. .................... 438/289 |
| 6,777,761 B2 | | 8/2004 | Clevenger et al. |
| 6,881,987 B2 * | | 4/2005 | Sohn ............................. 257/192 |
| 7,078,284 B2 | | 7/2006 | Trivedi |
| 7,084,025 B2 | | 8/2006 | Phua et al. |
| 2003/0011037 A1 | | 1/2003 | Chau et al. |
| 2003/0107088 A1 | | 6/2003 | Inumiya et al. |
| 2005/0087801 A1 | | 4/2005 | Lindert et al. |

FOREIGN PATENT DOCUMENTS

| | | |
|---|---|---|
| CN | 1416156 | 5/2003 |
| JP | 58-201363 | 11/1983 |
| WO | WO2005041288 | 5/2005 |

OTHER PUBLICATIONS

First Office Action from Chinese Patent Application No. 200580032453.1 mailed Aug. 22, 2008, 12 pgs.
Second Office Action from Chinese Patent Application No. 200580032453.1 mailed May 8, 2009, 17 pgs.
Noda, et al., "0.1 μm Delta-doped MOSFET Using Post Low-energy Implanting Selective Epitaxy," IEEE Symposium on VLSI Technology Digest of Technical Papers, 1994, 2 pgs.
Office Action from German Patent Application No. 11 2005 002 302.8-33 mailed May 7, 2008, 2 pgs.

(Continued)

*Primary Examiner* — Anh Mai
(74) *Attorney, Agent, or Firm* — Blakely, Sokoloff, Taylor & Zafman LLP (57) ABSTRACT

An MOS transistor formed on a heavily doped substrate is described. Metal gates are used in low temperature processing to prevent doping from the substrate from diffusing into the channel region of the transistor.

8 Claims, 7 Drawing Sheets

OTHER PUBLICATIONS

Notice of Preliminary Rejection from Korean Patent Application No. 10-2007-7007071 mailed Mar. 27, 2008, 4 pgs.

International Search Report and Written Opinion from PCT/US2005/035377 mailed Mar. 29, 2006, 11 pgs.

International Preliminary Report on Patentability from PCT/2005/035377 mailed Apr. 12, 2007, 8 pgs.

Non-final Office Action from U.S. Appl. No. 10/955,669 mailed Jan. 8, 2007, 8 pgs.

Third Office Action from Chinese Patent Application No. 200580032453.1 mailed Jan. 8, 2010, 12 pgs.

Decision on Rejection from Chinese Patent Application No. 200580032453.1 mailed Nov. 12, 2010, 23 pgs.

Decision on Rejection from Chinese Patent Application No. 200580032453.1 mailed Nov. 12, 2010, 14 pgs.

* cited by examiner

METAL GATE TRANSISTORS WITH RAISED SOURCE AND DRAIN REGIONS FORMED ON HEAVILY DOPED SUBSTRATE

REFERENCE TO RELATED APPLICATION

The present patent application is a Divisional of application Ser. No. 10/955,669, filed Sep. 29, 2004 now U.S. Pat. No. 7,332,439.

FIELD OF THE INVENTION

The invention relates to the field of MOS transistors, particularly those fabricated with epitaxial source and drain regions.

PRIOR ART AND RELATED ART

Delta-doped transistors are described in Noda et al. "0.1 μm Delta-Doped MOSFET Using Post Low Energy Implanting Selective Epitaxy," *VLSI Technology* 1994, *Digest of Technical Papers*. The motivation for the Delta-doped transistor is that higher mobility (less impurity scattering) is achieved with an un-doped or lightly doped channel. Such devices are also described in U.S. Pat. No. 7,060,576, titled "Epitaxially Deposited Source/Drain," assigned to the assignee of the present application.

The fabrication of these transistors relies in large part upon the difference in the doping levels between the heavily doped substrate and the lightly doped or un-doped epitaxially formed surface of the substrate. An etchant is able to discriminate between the surface region and the main body of the substrate because of this difference in doping levels. One problem that occurs, however, is that when the gate structures are formed, relatively high temperature processing is needed to, for instance, activate the doping in a polysilicon gate. This causes the diffusion of the dopant from the substrate into the channel region, thereby deteriorating the performance of the transistors.

DETAILED DESCRIPTION

A process for fabricating complementary metal-oxide-semiconductor (MOS) field-effect transistors and the resultant transistors are described. In the following description, numerous specific details are set forth such as specific dopant concentration levels, specific chemicals, etc. in order to provide a thorough understanding of the present invention. It will be apparent to one skilled in the art that these specific details are not required to practice the present invention. In other instances, well-known processing steps, such as cleaning steps, are not described in detail in order not to unnecessarily obscure the following disclosure.

Figure 1:
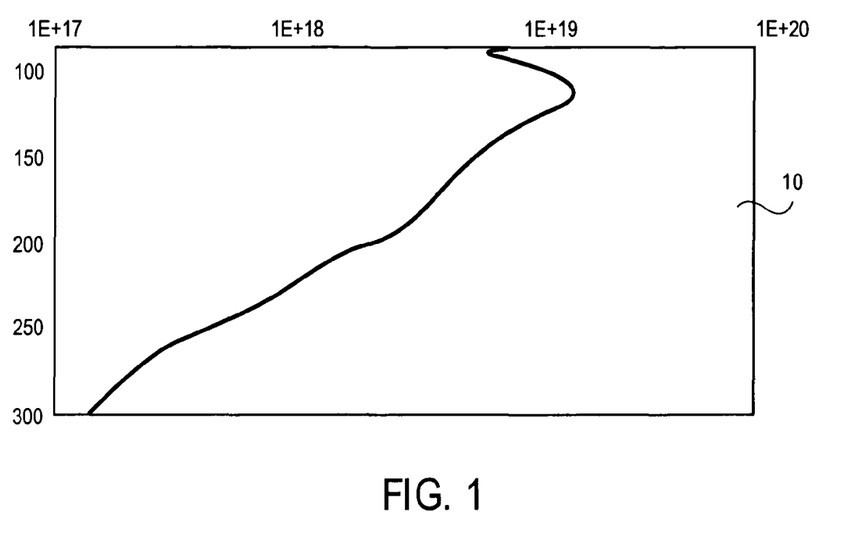
FIG. 1 is a cross-sectional, elevation view of the upper portion of a silicon substrate used to illustrate the doping profile in the upper region of the substrate.

In FIG. 1, the upper approximately 200 nanometers (nm) of a monocrystalline silicon substrate 10 is illustrated. As shown, the upper region of this substrate is heavily doped with a dopant such as boron. The doping profile illustrates that the doping level has a peak below the surface in excess of $10^{19}$ atoms/cm$^3$, or higher. This doping profile may be achieved using ion implantation.

Figure 2:
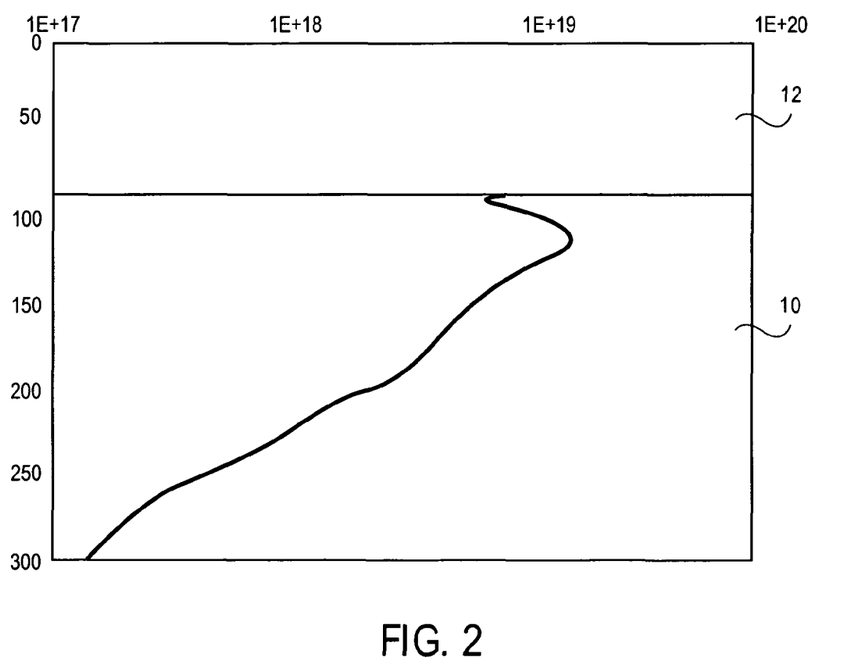
FIG. 2 illustrates the substrate of FIG. 1, after an un-doped or lightly doped semiconductor layer is grown on the substrate.

Following the doping of the substrate, a epitaxial layer, shown as a monocrystalline silicon layer 12, is formed on the upper surface of the substrate 10. For instance, the deposition of the epitaxial silicon layer 12 is carried out using dichlorosilane based chemistry in a single wafer CVD reactor, such as ASM E3000 reactor. The film is deposited with gas flows of 140-250 sccm of dicholoro silane ($SiH_2Cl_2$), 100-150 sccm HCl, 20 slm of $H_2$ at 825° C. and a process pressure of 20 Torr. Under these processing conditions, a deposition rate of 10-15 nm/min is achieved for silicon on the exposed substrate while achieving an excellent selectivity for spacer and oxide regions. The layer 12 may have the thickness of approximately 85 nm, and its doping concentration will be, for example, less than 1/100 of the buried peak doping concentration of the substrate.

Figure 3:
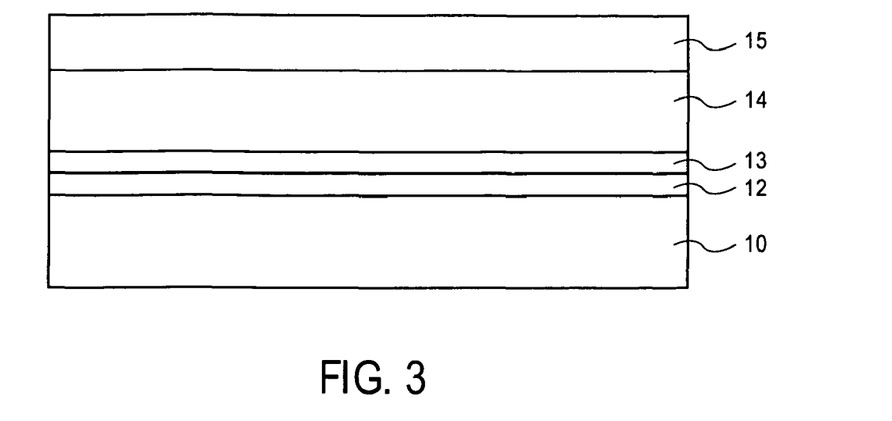
FIG. 3 is a cross-sectional, elevation view of the substrate and the semiconductor layer of FIG. 2, in addition to other layers used to form gates.

Following the formation of the layer 12, an insulative layer 13 is formed on layer 10. Layer 13 may be a thin, thermally grown oxide layer or a deposited silicon dioxide layer. Next, a polysilicon layer 14 is deposited on the insulative layer 13. As will be seen, gates formed from the layer 14 are sacrificial. They are subsequently removed and metal is substituted for the regions occupied by these polysilicon gates. A hard mask 15 is formed on the polysilicon layer 14.

Figure 4:
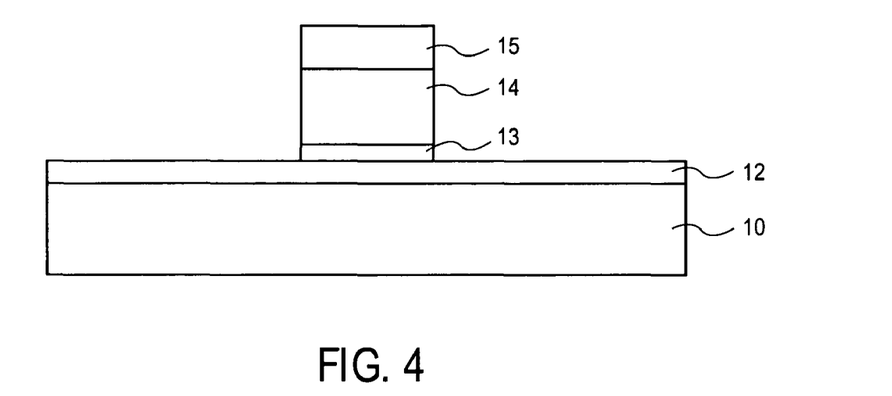
FIG. 4 illustrates the substrate of FIG. 3, after the formation of gates.

Next, as shown in FIG. 4, a sacrificial gate structure is fabricated by first masking and etching the hard mask layer 15 using ordinary photolithographic processing to define masking members for gates. Now, the polysilicon layer 14 and insulative layer 13 are etched in alignment with the hard mask 15 using ordinary etchants. The resultant structure is depicted in FIG. 4.

Figure 5:
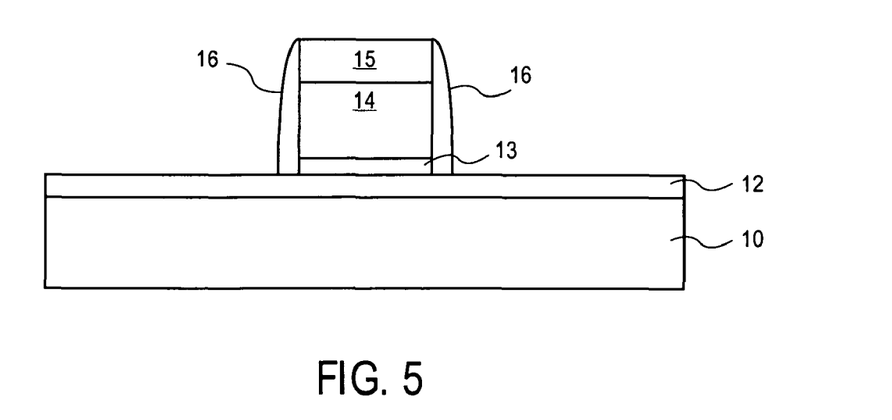
FIG. 5 illustrates the substrate of FIG. 4, after the formation of sidewall spacers on the gates.

As shown in FIG. 5, sidewalls 16 are then formed on the gate of FIG. 4. Relatively thin silicon nitride sidewall members 16 may be formed using ordinary sidewall processing. The purpose of these sidewall spacers is to protect the polysilicon during subsequent processing. Consequently, all sides of the polysilicon gate 14 are covered. Because the sidewall spacers are used for protection of the polysilicon, they may be relatively thin.

Now, the layer 12 is etched to form a channel body 12a. The etching undercuts the gate structure as shown by the undercuts 20 in FIG. 6.

Figure 6:
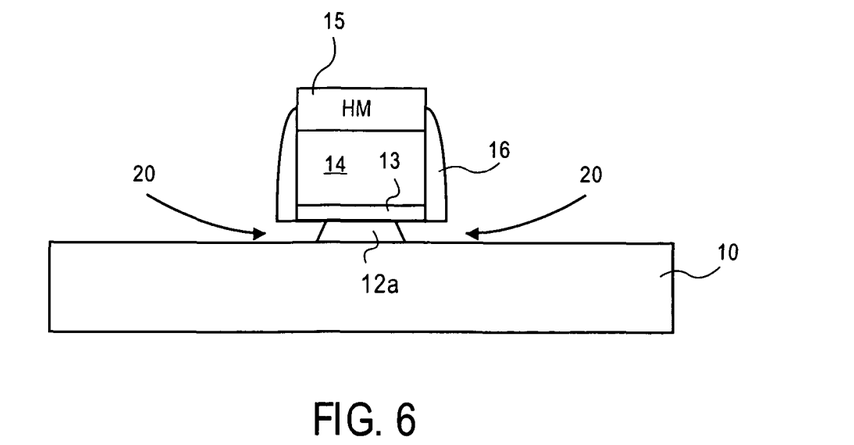
FIG. 6 illustrates the substrate of FIG. 5, after an etching step used to etch the semiconductor layer. This figure shows the undercutting of the gate.

The layer 12 may be etched with a variety of hydroxide-based solutions. However, for high selectivity to the heavily doped substrate, relatively mild processing conditions and a wet etchant are employed. One method is treatment with an aqueous ammonium hydroxide solution in the concentration range 2-10% by volume at 25 degrees Celsius with a sonication transducer which dissipates ultra- or mega-sonic energy at a power of 0.5 to 5 W/cm$^2$.

Figure 7:
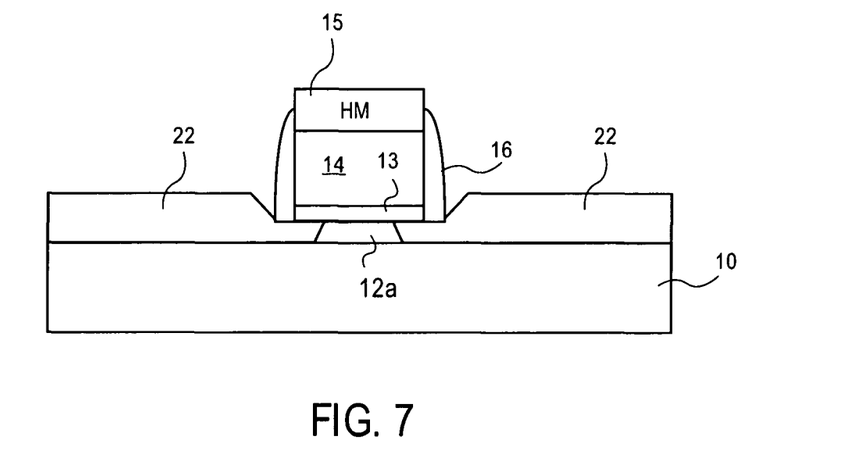
FIG. 7 illustrates the substrate of FIG. 6 following the epitaxial growth of source and drain regions.

Source and drain regions are then grown to establish a shallow, highly doped source/drain tip (extension) that laterally extends the distance under the gate edge to the channel body 12a. Separate processing is used for the p-channel and n-channel transistors with each of the source and drain regions being grown in different processing steps, both with in-situ doping. This results in the source and drain regions being highly doped, in one case with a p-type dopant, and in the other case with an n-type dopant.

In forming a PMOS transistor, the source/drain extension (tip) are raised source/drain regions formed by selectively depositing epitaxial boron (B) doped silicon or SiGe with germanium concentrations up to 30%. Under the processing conditions of 100 sccm of dichlorosilane (DCS), 20 slm H$_2$, 750-800° C., 20 Torr, 150-200 sccm HCl, a diborane (B$_2$H$_6$) flow of 150-200 sccm and aGeH$_4$ flow of 150-200 sccm, a highly doped SiGe film with a deposition rate of 20 nm/min, B concentration of 1E20 cm$^{-3}$ and a germanium concentration of 20% is achieved. A low resistivity of 0.7-0.9 mOhm-cm resulting from the high B concentration in the film provides the benefit of high conductivity in the tip source/drain regions and thereby reduced R$_{external}$. SiGe in the source/drain regions exerts compressive strain on the channel, which in turn results in enhanced mobility and improved transistor performance.

For an NMOS transistor, the source/drain regions are formed using in-situ phosphorous doped silicon deposited selectively under processing conditions of 100 sccm of DCS, 25-50 sccm HCl, 200-300 sccm of 1% Ph$_3$ with a carrier H$_2$ gas flow of 20 slm at 750° C. and 20 Torr. A phosphorous concentration of 2E20 cm$^{-3}$ with a resistivity of 0.4-0.6 mOhm-cm is achieved in the deposited film.

Figure 8:
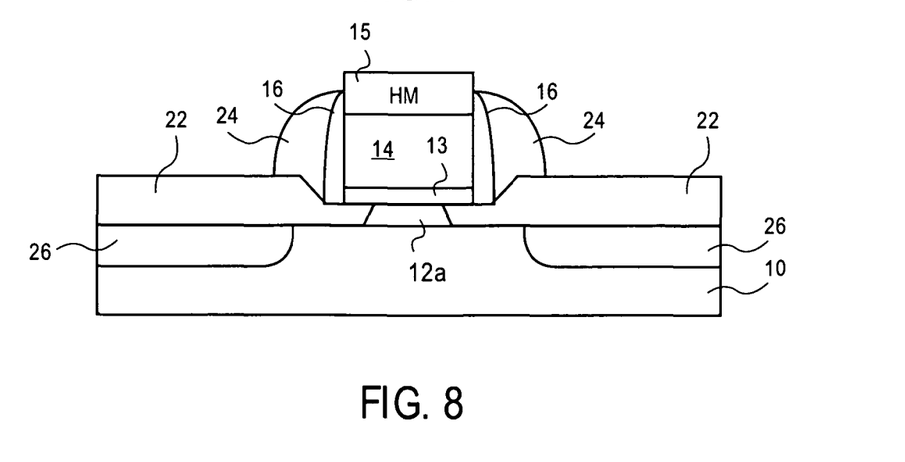
FIG. 8 illustrates the structure of FIG. 7, after the formation of additional spacers and the doping of the exposed portion of the source and drain regions.

After the source/drain regions are formed as illustrated in FIG. 7, additional spacers 24 are formed using ordinary processing. As an example, the spacers may be a silicon nitride or silicon dioxide spacers. Spacers 24 are relatively thick when compared to the thickness of the spacer 16 as shown in FIG. 8.

Ion implantation now occurs to from the source/drain regions 26 in the substrate 10. Again, separate ion implantation processes are used for the p-type dopant and n-type dopant. The regions 26 may be implanted to a level of 10$^{20}$ atoms/cm$^3$.

Figure 9:
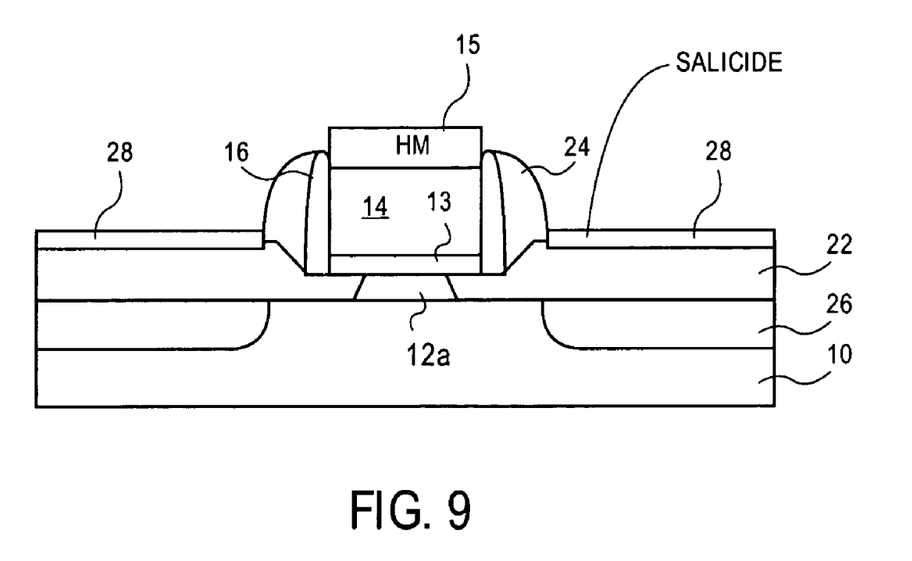
FIG. 9 illustrates the structure of FIG. 8 following the formation of a salicide layer.

As shown in FIG. 9, an ordinary silicide or salicide process is used to form the salicide layer 28 thereby making the upper surface of the source/drain regions more conductive.

Figure 10:
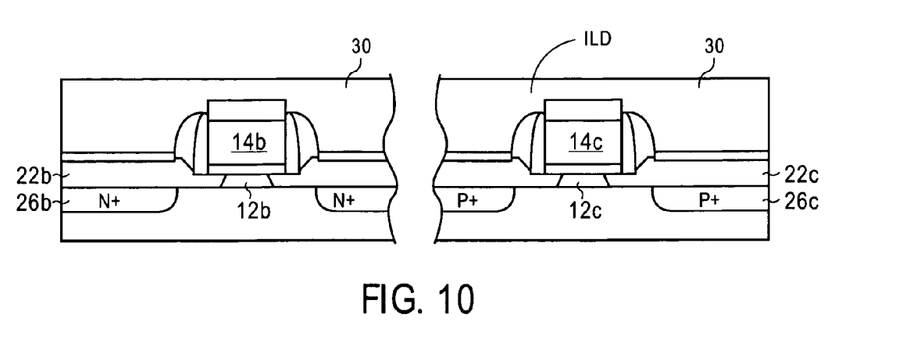
FIG. 10 illustrates the structure of FIG. 9 where two transistors are shown side-by-side, specifically an n-channel transistor and a p-channel transistor are depicted.

In FIG. 10, an n-channel transistor is depicted along side a p-channel transistor. The channel regions are shown as 12b for the n-channel transistor and 12c for the p-channel transistor. The letter "b" is used below, to denote the layers and regions for the n-channel transistor, and similarly, the letter "c" is used to designate the layers and regions for the p-channel transistor. The structure shown in FIG. 10 is the same as shown in FIG. 9 except that an ILD 30 is formed over the wafer. Any one of a plurality of dielectrics may be used for the ILD such as silicon dioxide, carbon doped silicon dioxide or other low-k dielectrics.

Figure 11:
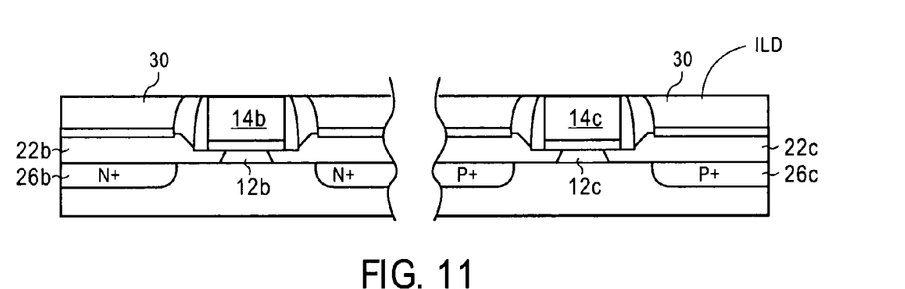
FIG. 11 illustrates the structure of FIG. 10 following the chemical mechanical polishing (CMP) of an interlayer dielectric (ILD).

Now, CMP is used to provide a planarized surface and to remove the salicide from the top of the gates 14b and 14c. The resultant structure is illustrated in FIG. 11.

Figure 12:
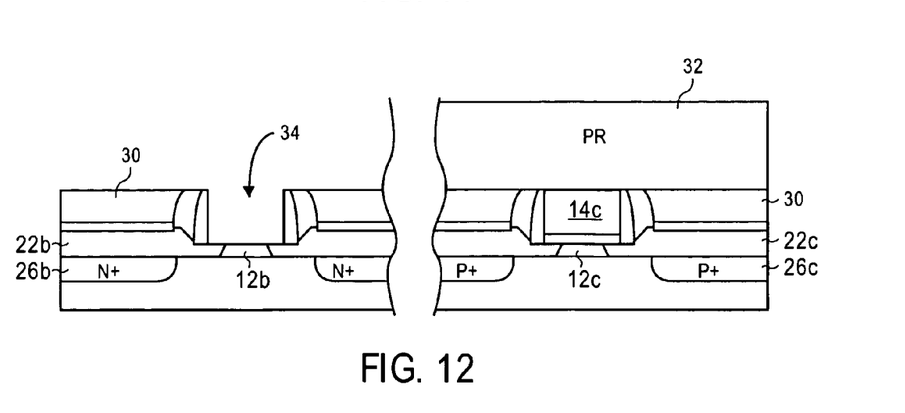
FIG. 12 illustrates the structure of FIG. 11, after the formation of a photoresist layer over the p-channel transistor region and the removal of the polysilicon gate and its underlying insulative layer from the n-channel gate.

Next, a photoresist layer 32 is formed over the p-channel transistors, and a wet etchant is used to remove the polysilicon from the n-channel transistors. The underlying insulative layer is also removed, forming the opening 34 depicted in FIG. 12.

Figure 13:
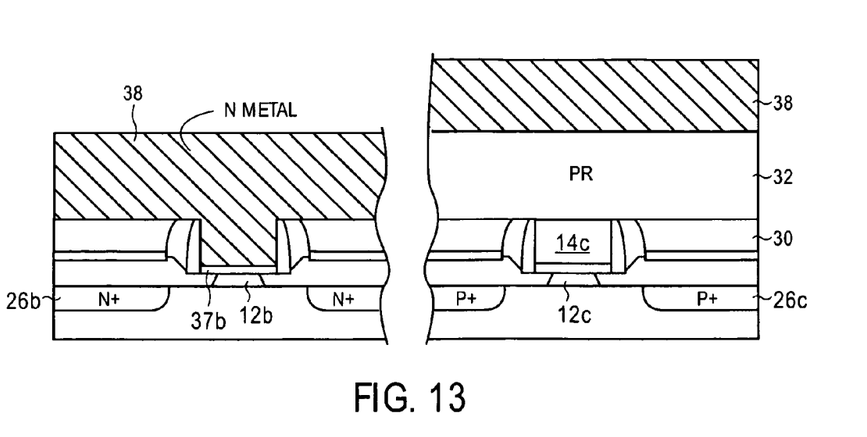
FIG. 13 illustrates the structure of FIG. 12 following the formation of an n-metal layer.

Now, as shown in FIG. 13, an insulative layer 37b is formed along with a metal layer 38, referred to as "n-metal" since it is the metal having the appropriate work function for the n-channel transistors. The gate dielectric, ideally has a high electric constant, such as a metal oxide dielectric, for instance, HfO$_2$, ZrO$_2$ or other high-k dielectrics, such as PZT or BST. A high-k dielectric film can be formed by any well-known technique such as by chemical vapor deposition (CVD). The gate electrode layer 38 may be formed by blanket deposition of a suitable gate electrode material. In one embodiment, a gate electrode material comprises a metal film such as tungsten, tantalum and/or nitrides and alloys thereof. For the n-channel transistors, a work function in the range of 4.0 to 4.6 eV may be used.

Figure 14:
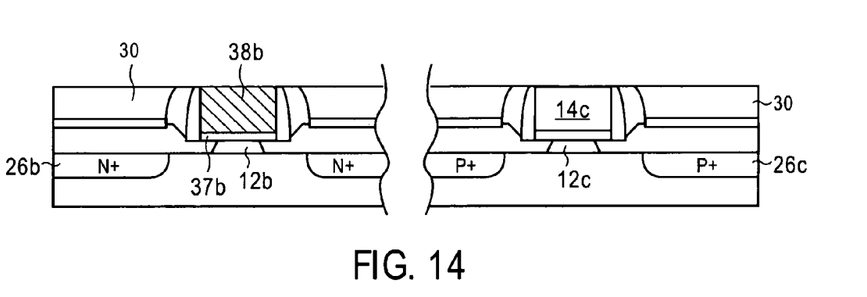
FIG. 14 illustrates the structure of FIG. 13 following a CMP process.

CMP is next used to planarize the surface, thereby removing the metal layer 38, except within the region formerly occupied by the polysilicon, gate. The resultant gate 38b and the underlying insulative layer 37b are illustrated in FIG. 14.

A wet etchant is used to remove the polysilicon gate associated with the p-channel transistors. Again, the underlying insulative layer is also removed so that a more appropriate insulative layer may be formed. The opening 42 of FIG. 15 results after the polysilicon gate and the underlying insulative layer are removed. A gate dielectric 37c is formed on the exposed silicon. This dielectric may be the same as dielectric 37b.

Figure 15:
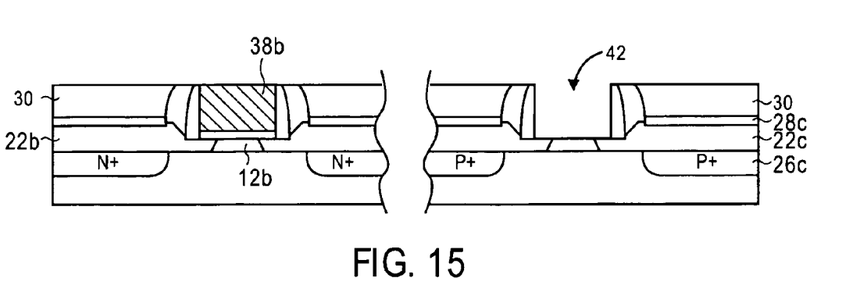
FIG. 15 illustrates the structure of FIG. 14 after the removal of the polysilicon gate and its underlying insulative layer from the p-channel gate.
Figure 16:
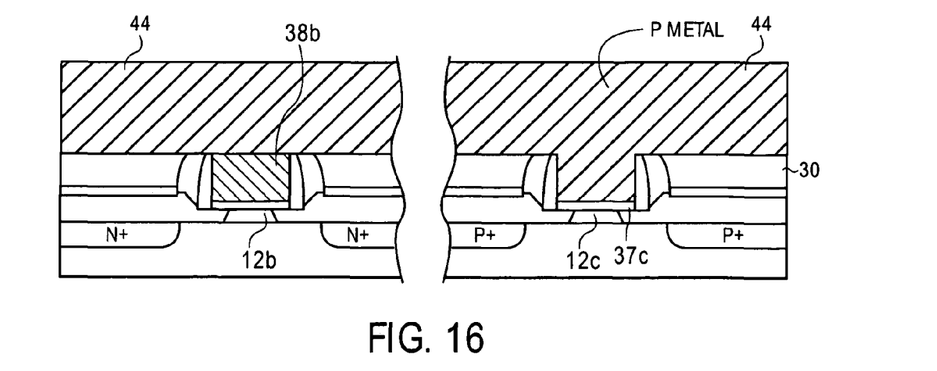
FIG. 16 illustrates the structure of FIG. 15 following the deposition of a p-metal.

A metal layer 44 is formed over the structure of FIG. 15 and the gate dielectric 37b. This is shown as a "p-metal" in FIG. 16 since the work function of this metal is appropriate for p-channel transistors. The p-metal may be of the same composition as the n-metal except that the work function is preferable between 4.6 to 5.2 eV.

Figure 17:
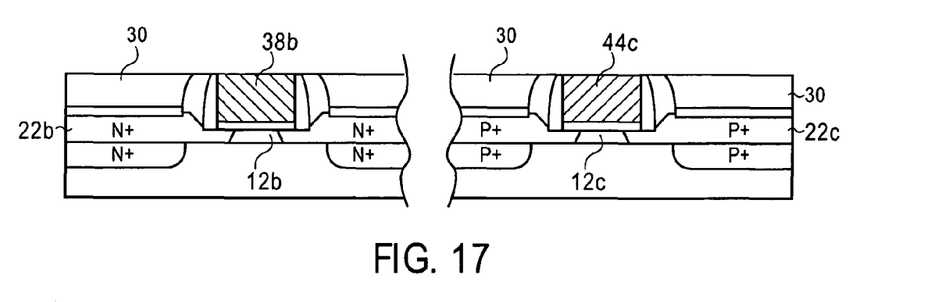
FIG. 17 illustrates the structure of FIG. 16 following a CMP process.

After the deposition of the p-metal, CMP is used to planarize the structure with the resultant structure being shown in FIG. 17. An n-channel transistor with a gate 37b and a channel region 12b results, and similarly, a p-channel transistor with a gate 44c and a channel region 12c results.

There are several advantages to the transistors of FIG. 17 and their fabrication when compared to prior art transistors. First, shallow tip (extension) junction depths are desirable to help support smaller transistor dimensions. When using traditional implanted tip techniques, minimum tip junction depths are limited by the necessary gate overlap. With the structure of FIG. 17 and the described processing, the gate overlap dimension and the junction depth can be better controlled. For instance, the wet etch can be timed to determine the extent of undercutting under the gate structure.

The shallow tip junction depths allow fabrication of shorter gate lengths without increasing off-state leakage current. Tip doping is needed under the gate edge to assure a low resistance path between the inversion layer under the gate and the highly doped source/drain tip region. The low resistance permits higher drive currents which are critical for circuit switching speed.

An advantage of the metal gate is that the processing can occur at lower temperatures. This is in addition to the better performance achieved with the metal gate when compared to a polysilicon gate. In the processing described above, lower temperature options are used to reduce the total thermal exposure. This as mentioned earlier, prevents the dopant from the substrate from diffusing into the channel region.

Thus, a delta-doped transistor with a metal gate and method of fabrication have been described.

What is claimed is:

1. A PMOS transistor comprising:
a monocrystalline silicon substrate comprising a heavily doped upper region;
an un-doped or lightly doped monocrystalline silicon channel region disposed directly on an uppermost surface of the monocrystalline silicon substrate and having a top surface;
a pair of source and drain regions, each source and drain region comprising an epitaxial silicon germanium first portion disposed directly on the uppermost surface of the monocrystalline silicon substrate, directly adjacent to the un-doped or lightly doped monocrystalline silicon channel region and extending upwards directly from the uppermost surface of the monocrystalline silicon substrate to above the top surface of the un-doped or lightly doped monocrystalline silicon channel region, and each source and drain region further comprising a second portion extending only partially into the monocrystalline silicon substrate, the second portion directly below the first portion; and
a metal gate insulated from and disposed above and over the un-doped or lightly doped monocrystalline silicon channel region, and above and over at least a part of the first portion of each of the source and drain regions, wherein the first portion of each of the source and drain regions comprises an angled faceted profile between the epitaxial silicon germanium and the un-doped or lightly doped monocrystalline silicon channel region underneath the metal gate, and wherein the second portion of each of the source and drain regions comprises only one rounded diffusion corner profile, the one rounded diffusion corner profile below, but not underneath, the metal gate.

2. The transistor of claim 1, further including first sidewall spacers disposed about the metal gate.

3. The transistor of claim 2, further including a silicide layer on at least a part of the first portion of each of the source and drain regions.

4. The transistor of claim 1, wherein the heavily doped upper region of the monocrystalline silicon substrate has a peak doping concentration of $10^{19}$ atoms/cm$^3$ or greater.

5. A PMOS transistor comprising:
a monocrystalline silicon substrate comprising a heavily doped upper region;
an un-doped or lightly doped monocrystalline silicon channel region disposed directly on an uppermost surface of the monocrystalline silicon substrate and having a top surface;
a pair of source and drain regions, each source and drain region comprising an epitaxial silicon germanium first portion disposed directly on the uppermost surface of the monocrystalline silicon substrate, directly adjacent to the un-doped or lightly doped monocrystalline silicon channel region and extending upwards directly from the uppermost surface of the monocrystalline silicon substrate to above the top surface of the un-doped or lightly doped monocrystalline silicon channel region, and each source and drain region further comprising a second portion extending only partially into the monocrystalline silicon substrate, the second portion directly below the first portion; and
a non-silicon metal gate insulated from and disposed over the un-doped or lightly doped monocrystalline silicon channel region, and over at least a part of the first portion of each of the source and drain regions, wherein the first portion of each of the source and drain regions comprises an angled faceted profile between the epitaxial silicon germanium and the un-doped or lightly doped monocrystalline silicon channel region underneath the non-silicon metal gate, and wherein the second portion of each of the source and drain regions comprises only one rounded diffusion corner profile, the one rounded diffusion corner profile below, but not underneath, the non-silicon metal gate.

6. The transistor of claim 5, further including first sidewall spacers disposed about the metal gate.

7. The transistor of claim 6, further including a silicide layer on at least a part of the first portion of each of the source and drain regions.

8. The transistor of claim 5, wherein the heavily doped upper region of the monocrystalline substrate has a peak doping concentration of $10^{19}$ atoms/cm$^3$ or greater.

* * * * *